(12) United States Patent
Kuboi et al.

(10) Patent No.: US 12,309,937 B2
(45) Date of Patent: May 20, 2025

(54) MOTOR CONTROL SYSTEM, MOTOR CONTROL DEVICE, AND MOTOR CONTROL METHOD

(71) Applicant: Panasonic Intellectual Property Management Co., Ltd., Osaka (JP)

(72) Inventors: Yusuke Kuboi, Osaka (JP); Hiroshi Fujiwara, Osaka (JP); Kenta Murakami, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 166 days.

(21) Appl. No.: 18/262,570

(22) PCT Filed: Dec. 8, 2021

(86) PCT No.: PCT/JP2021/045124
§ 371 (c)(1),
(2) Date: Jul. 22, 2023

(87) PCT Pub. No.: WO2022/163146
PCT Pub. Date: Aug. 4, 2022

(65) Prior Publication Data
US 2024/0081034 A1 Mar. 7, 2024

(30) Foreign Application Priority Data
Jan. 28, 2021 (JP) ................................ 2021-011634
May 11, 2021 (JP) ................................ 2021-080653

(51) Int. Cl.
*G05D 3/00* (2006.01)
*G05B 23/02* (2006.01)
(Continued)

(52) U.S. Cl.
CPC .............................. *H05K 13/0882* (2018.08)

(58) Field of Classification Search
CPC ........... G05D 3/00; H02P 29/00; G05B 23/02; H05K 13/0406; H05K 13/0882
(Continued)

(56) References Cited

U.S. PATENT DOCUMENTS 4,908,738 A * 3/1990 Kobari ............... H05K 7/14322
439/74
5,493,194 A * 2/1996 Damiano ............. H05K 7/1484
318/575
(Continued)

FOREIGN PATENT DOCUMENTS

JP 05-029795 2/1993
JP 05-297954 11/1993

OTHER PUBLICATIONS

International Search Report of PCT application No. PCT/JP2021/045124 dated Feb. 8, 2022.

*Primary Examiner* — Gabriel Agared
(74) *Attorney, Agent, or Firm* — Rimon P.C.

(57) ABSTRACT

Motor control system includes controller, motor control device, and position detection device. In controller, an operation command plan for a movement plan during a period until moving part reaches a target position from an initial position is set. Controller outputs, as an operation command, a movement amount of the moving part at a current point in time based on the operation command plan. Motor control device generates a drive signal for drive device based on an operation command Position detection device detects a position of moving part, and outputs a first position. Motor control device generates a deviation amount of moving part from the target position based on a future movement distance of moving part based on a future operation command, the first position, and the target position. Motor control device outputs a notification signal in a case
(Continued)

where the deviation amount is more than or equal to a threshold.

13 Claims, 9 Drawing Sheets

(51) Int. Cl.
*H02P 29/00* (2016.01)
*H05K 13/08* (2006.01)

(58) Field of Classification Search
USPC .......................................................... 318/565
See application file for complete search history.

(56) References Cited

U.S. PATENT DOCUMENTS

| | | | | |
|---|---|---|---|---|
| 6,865,446 B2* | 3/2005 | Yokono | ................. | B25J 9/1633 |
| | | | | 700/257 |
| 10,318,772 B1* | 6/2019 | Steinweg | ............. | G05B 19/042 |
| 2003/0135991 A1* | 7/2003 | Nagao | ................ | H05K 13/0404 |
| | | | | 29/710 |
| 2004/0201972 A1* | 10/2004 | Walesa | ................ | H05K 7/1484 |
| | | | | 361/788 |
| 2008/0023211 A1* | 1/2008 | Yee | ....................... | H01H 9/226 |
| | | | | 174/50.52 |
| 2011/0295428 A1* | 12/2011 | Wang | ................ | G05B 19/4142 |
| | | | | 700/275 |
| 2013/0279081 A1* | 10/2013 | Feldmeier | ................ | H02H 7/09 |
| | | | | 361/608 |

\* cited by examiner

MOTOR CONTROL SYSTEM, MOTOR CONTROL DEVICE, AND MOTOR CONTROL METHOD

TECHNICAL FIELD

The present disclosure relates to a motor control system, a motor control device, a motor control method, and a program for controlling a motor in a production apparatus or the like.

BACKGROUND ART

Hereinafter, a production apparatus using a motor control system of the related art will be described. The production apparatus includes a motor control system, a motor, and a moving part. The motor control system includes a controller, a motor control device, and a camera. The camera transmits imaged data to the controller. The production apparatus is an electronic component mounter that mounts an electronic component or the like on a printed board, for example. In this case, the moving part includes a mounting head. Note that the camera moves together with the moving part (mounting head).

The controller determines a position of the mounting head based on the received data, generates a target position when the motor moves based on the determined position, and transmits, as an operation command (position command), the target position to the motor control device. At this time, the controller compares a previously output operation command with the position of the mounting head detected by the camera, and generates an operation command corresponding to a difference. The motor control device generates a drive signal for driving the motor based on the operation command. The motor moves the moving part by the drive signal.

Note that, for example, PTL 1 is known as information on prior art documents related to the present disclosure.

CITATION LIST

Patent Literature

PTL 1: Unexamined Japanese Patent Publication No. H5-29795

SUMMARY OF THE INVENTION

However, in the motor control device of the related art, the controller generates the operation command of the motor based on the position detected by the camera. Accordingly, for example, in a case where the camera is deviated from a predetermined position due to an external force or the like, there is a problem that the moving part moves from a normal position to the deviated position.

Therefore, the present disclosure has been made to solve this problem, and an object thereof is to provide a motor control system, a motor control device, a motor control method, and a program capable of detecting a deviation of a moving part from a target position.

A motor control system of the present disclosure includes a controller, a motor control device, and a position detection device. The controller includes a first signal processing circuit. In the first signal processing circuit, an operation command plan is set for a movement plan during a period until a moving part reaches a target position from an initial position. In addition, the first signal processing circuit outputs, as an operation command, a movement amount of the moving part at a current point in time based on the operation command plan. The motor control device includes a second signal processing circuit. The second signal processing circuit generates a drive signal of a drive device that moves the moving part based on the operation command. The position detection device detects a position of the moving part, and outputs, as a first position, the detected position of the moving part. In the above configuration, the second signal processing circuit generates a deviation amount of the moving part between the first position and the target position based on a future movement distance of the moving part based on a future operation command in the operation command plan, the first position, and the target position. Further, a notification signal is output in a case where the deviation amount is more than or equal to a predetermined threshold. This structure can achieve the intended object.

In addition, a motor control device of the present disclosure includes a second signal processing circuit that generates a drive signal of a drive device that moves a moving part based on an operation command output from a controller that outputs, as the operation command, a movement amount of the moving part at a current point in time based on an operation command plan for a movement plan during a period until the moving part reaches a target position from an initial position. The second signal processing circuit generates a deviation amount of the moving part from the target position based on a future movement distance of the moving part based on a future operation command in the operation command plan, a first position output from a position detection device that detects a position of the moving part and outputs, as the first position, the detected position of the moving part, and the target position, and outputs a notification signal in a case where the deviation amount is more than or equal to a predetermined threshold. This structure can achieve the intended object.

In addition, a motor control method of the present disclosure includes outputting, as an operation command, a movement amount of a moving part at a current point in time based on an operation command plan set for a movement plan during a period until the moving part reaches a target position from an initial position, generating a drive signal of a drive device that moves the moving part based on the operation command, detecting a position of the moving part, and outputting, as a first position, the detected position of the moving part. The motor control method further includes generating a deviation amount of the moving part from the target position based on a future movement distance of the moving part based on a future operation command in the operation command plan, the first position, and the target position, and outputting a notification signal in a case where the deviation amount is more than or equal to a predetermined threshold. This structure can achieve the intended object.

In addition, a program of the present disclosure is a program causing a computer to execute the above motor control method. This structure can achieve the intended object.

As described above, according to the present disclosure, it is possible to generate the deviation amount of the moving part from the target position in a case where the drive device is operated according to the operation command plan, based on the distance to the target based on the detection information in the position detection device and the movement distance of the moving part based on the future operation command. Since the notification signal is output based on the detected deviation amount, an operator who uses the motor control system or the like, or an administrator and a maintenance person of the system or the like can easily grasp that the moving part is deviated from the target position.

DESCRIPTION OF EMBODIMENT

Hereinafter, a motor control system according to an exemplary embodiment of the present disclosure will be described.

Exemplary Embodiment

Hereinafter, a motor control system and a motor control device according to the present exemplary embodiment will be described with reference to the drawings. Note that, in the accompanying drawings, components may be simply illustrated for easy understanding.

Figure 1:
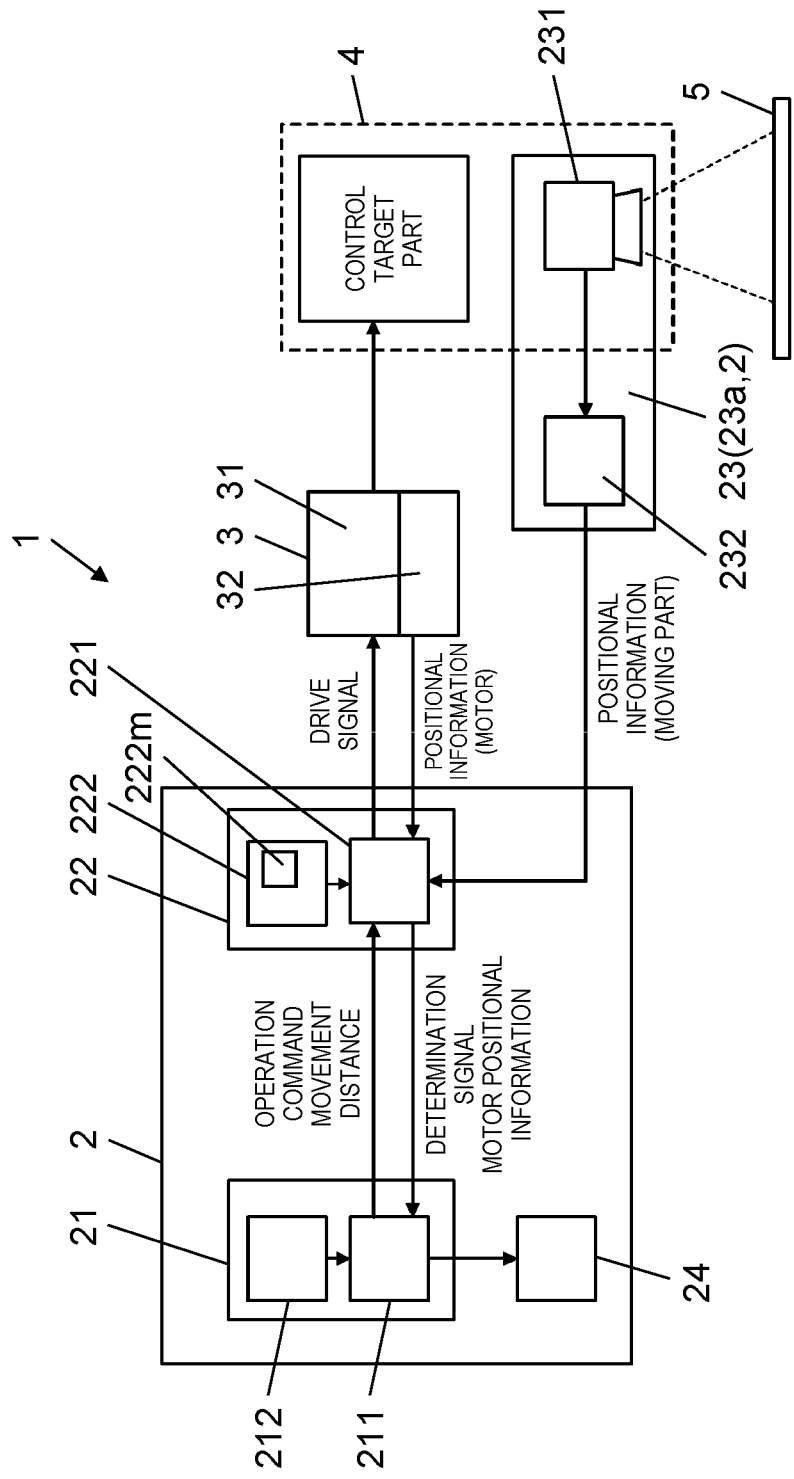
FIG. 1 is a schematic block diagram of a production apparatus using a motor control system according to an exemplary embodiment of the present disclosure.
Figure 2:
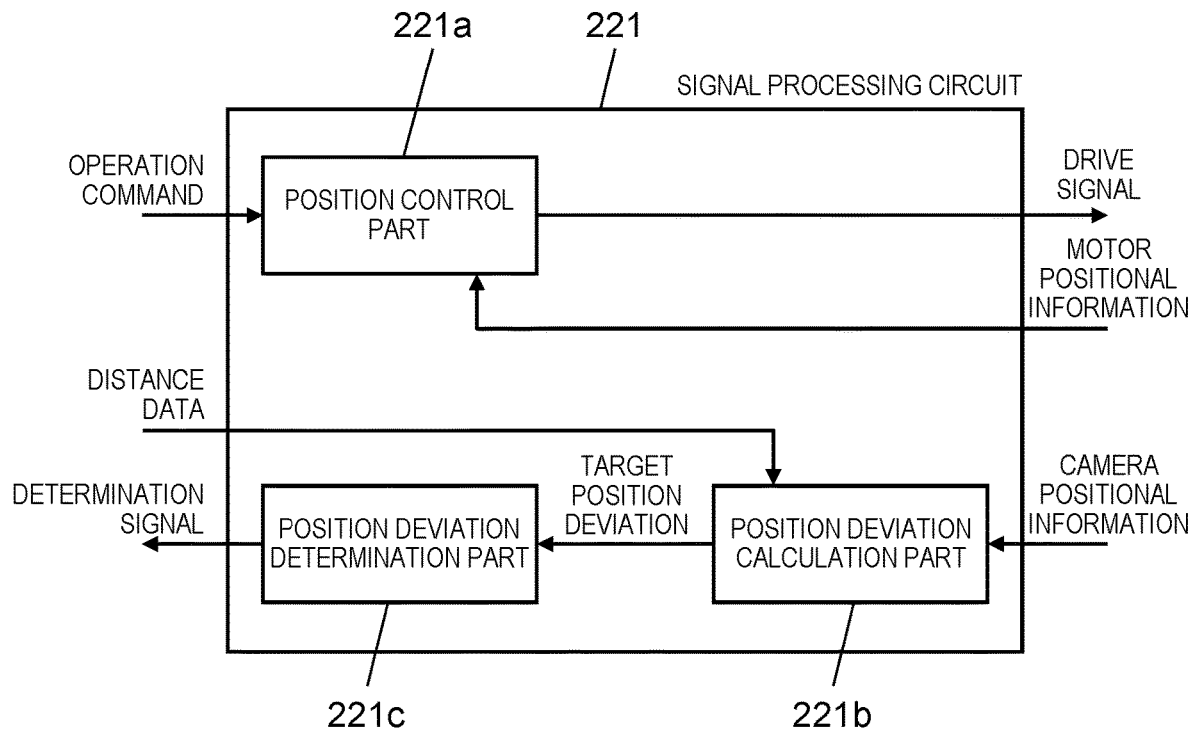
FIG. 2 is a conceptual diagram of processing blocks in a signal processing circuit in the motor control device.
Figure 3:
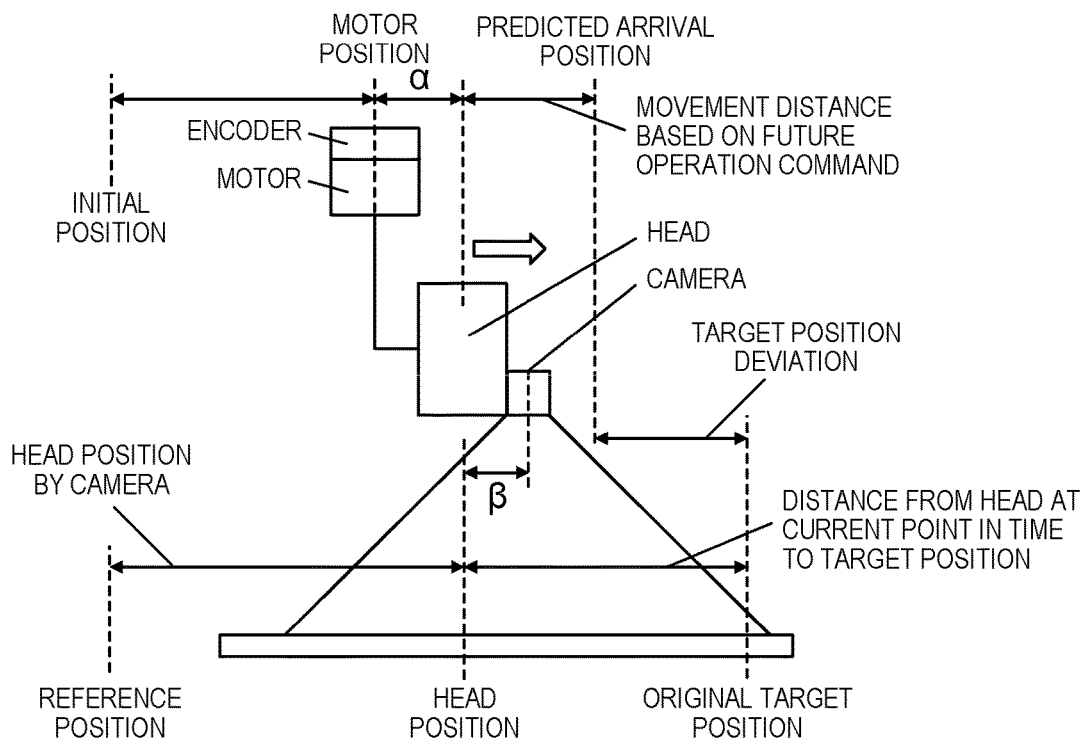
FIG. 3 is an explanatory diagram illustrating processing in the signal processing circuit.
Figure 11:
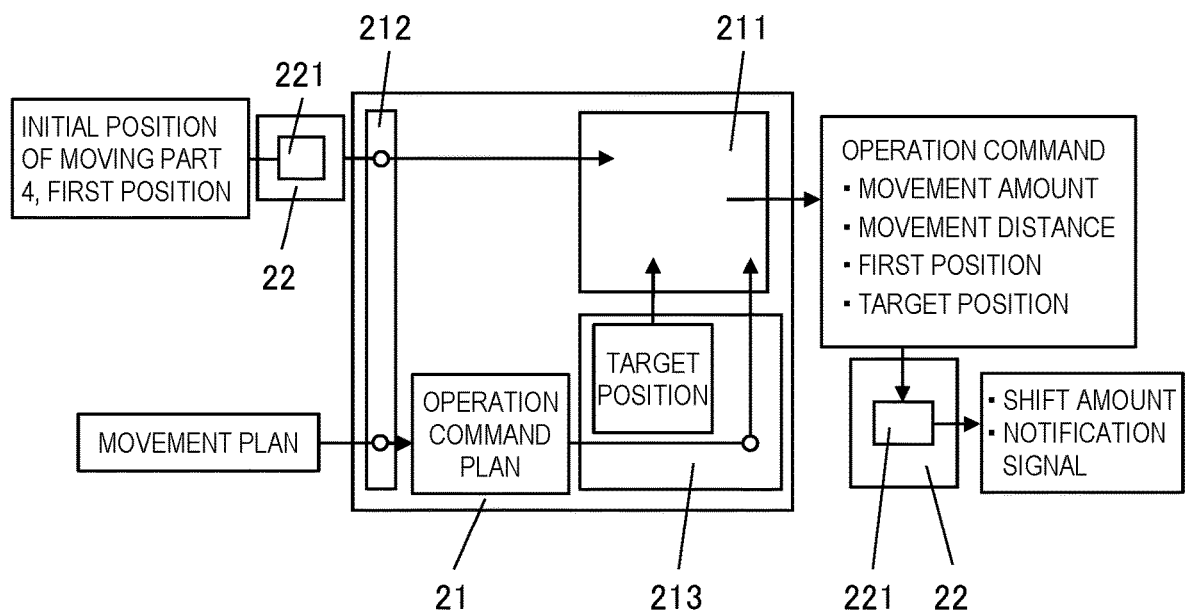
FIG. 11 is an explanatory diagram illustrating processing in a controller and a control device of the motor control system according to the exemplary embodiment of the present disclosure.

FIG. 1 is a schematic block diagram of a production apparatus using the motor control system. FIG. 2 is a conceptual diagram of processing blocks in a signal processing circuit in the motor control device. FIG. 3 is an explanatory diagram illustrating processing in the signal processing circuit in the motor control device. FIG. 11 is an explanatory diagram illustrating a controller in the motor control device and signal processing in the motor control device.

In FIGS. 1 to 3 and 11, production apparatus 1 includes motor control system 2, drive device 3, and moving part 4. Production apparatus 1 is, for example, an electronic component mounter that mounts an electronic component on printed circuit board 5. In this case, moving part 4 includes a mounting head. The mounting head moves on printed circuit board 5 in a state where the electronic component is sucked, and mounts the electronic component at a predetermined target position on printed circuit board 5. Drive device 3 moves moving part 4.

Motor control system 2 includes controller 21, motor control device 22, and position detection device 23. Position detection device 23 is, for example, an imaging device such as a camera. Controller 21 includes signal processing circuit 211, input device 212, and memory 213. Signal processing circuit 211 is an example of a first signal processing circuit. Signal processing circuit 211 processes an operation command plan set for an input movement plan. The movement plan is a plan in which moving part 4 moves on printed circuit board 5 during a period until moving part 4 reaches a target position from an initial position. That is, in controller 21, the operation command plan is set for the movement plan during a period until moving part 4 reaches the target position from the initial position. For example, an operator of controller 21 inputs the movement plan to controller 21 by input device 212. Controller 21 generates the operation command plan according to the input movement plan, and stores the operation command plan in memory 213 in controller 21. The operation command plan is an operation command to be output to motor control device 22 during a period until moving part 4 reaches the target position from the initial position. Signal processing circuit 211 outputs, as the operation command, a movement amount of moving part 4 at a current point in time based on the operation command plan.

Motor control device 22 includes signal processing circuit 221. Signal processing circuit 221 is an example of a second signal processing circuit. Signal processing circuit 221 generates a drive signal of drive device 3 that moves moving part 4 based on the operation command. That is, signal processing circuit 221 generates the drive signal based on the operation command. The drive signal is supplied to drive device 3, and moving part 4 is moved based on the drive signal.

Position detection device 23 moves together with moving part 4. Position detection device 23 detects a position of moving part 4. Position detection device 23 outputs the detected position of moving part 4 as positional information of moving part 4. Specifically, for example, position detection device 23 outputs, as a first position, the detected position of moving part 4. Note that position detection device 23 does not need to move together with moving part 4, and may be fixed at a position where the position of moving part 4 can be detected. Specifically, for example, in a case where position detection device 23 is an imaging device, position detection device 23 may be fixed at a position where the target position can be captured. In this case, position detection device 23 can detect the position of moving part 4 from a positional relationship between moving part 4 and the target position when moving part 4 is positioned in a range that can be captured by position detection device 23.

Hereinafter, generation of a deviation amount of moving part 4 from the target position will be described. As illustrated in FIG. 11, position detection device 23 detects an initial position of moving part 4 and a current position (first position) of moving part 4. The initial position of moving part 4 and the first position (current position) of moving part 4 are input to controller 21 by input device 212 via signal processing circuit 221 of motor control device 22. Signal processing circuit 211 outputs, as the operation command, the movement amount and the movement distance of moving part 4 at a current point in time to motor control device 22 based on the operation command plan from data indicating the initial position of moving part 4 and the current position of moving part 4.

Signal processing circuit 221 generates the deviation amount of moving part 4 from the target position based on a future movement distance of moving part 4 based on a future operation command in the operation command plan, the positional information of moving part 4, and the target position set in advance in controller 21. Specifically, for example, signal processing circuit 221 generates the deviation amount of moving part 4 from the target position based on the future movement distance of moving part 4 based on the future operation command in the operation command plan, the first position, and the target position set in advance in controller 21. Further, signal processing circuit 221 outputs a notification signal in a case where the generated deviation amount is more than or equal to a predetermined threshold.

With the above configuration, signal processing circuit 221 can generate the deviation amount of moving part 4 from the target position in a case where drive device 3 is operated according to the operation command plan based on a distance to the target position based on the positional information detected by position detection device 23 and the movement distance of moving part 4 based on the future operation command. Specifically, for example, signal processing circuit 221 generates the deviation amount of moving part 4 from the target position in a case where drive device 3 is operated according to the operation command plan based on a difference between a distance from the first position to the target position and the future movement distance of moving part 4 based on the future operation command in the operation command plan. For example, the deviation amount of moving part 4 from the target position in a case where drive device 3 is operated according to the operation command plan is a deviation amount between a predicted arrival position at which moving part 4 is predicted to arrive in a case where drive device 3 is operated according to the operation command plan and the target position of moving part 4. Signal processing circuit 221 outputs a notification signal based on the generated deviation amount. Accordingly, a subject (including, for example, an operator who uses production apparatus 1 or an administrator and a maintenance person of production apparatus 1) involved in production apparatus 1 (motor control system 2) can easily and quickly grasp that moving part 4 is deviated from the target position.

Hereinafter, motor control system 2 will be described in more detail. Motor control system 2 includes notification device 24. With this configuration, the subject can easily and quickly grasp that moving part 4 is deviated from the target position by issuing a warning to notification device 24.

Notification device 24 is connected to controller 21. Notification device 24 is, for example, a display part. In this case, notification device 24 displays a warning indicating that moving part 4 is deviated from the target position on the display part based on the notification signal. Alternatively, notification device 24 may be a warning lamp. In this case, notification device 24 turns on the warning lamp based on the notification signal. Note that notification device 24 is not limited to be connected to controller 21, but may be connected to motor control device 22. Alternatively, notification device 24 may be a warning lamp, a display, or the like provided in advance in production apparatus 1. In addition, notification device 24 may be included in controller 21 or motor control device 22.

Position detection device 23 is, for example, imaging device 23a, In this case, imaging device 23a includes camera 231 and image processing device 232. Camera 231 is fixed to moving part 4 (for example, the mounting head).

In this case, moving part 4 also includes camera 231. Camera 231 acquires an image of an imaging target (for example, printed circuit board 5). Image processing device 232 acquires the positional information of moving part 4 based on the captured image, and outputs the positional information to motor control device 22. Note that, although image processing device 232 is outside motor control device 22, motor control device 22 may include image processing device 232. In this case, signal processing circuit 221 may include image processing device 232.

Drive device 3 includes motor 31 and encoder 32. Motor 31 moves moving part 4 by the drive signal generated based on the operation command. Encoder 32 detects a position of motor 31 and outputs position data to signal processing circuit 221. For example, encoder 32 detects a position of motor 31 at a current point in time and outputs position data indicating a position of motor 31 at a current point in time.

Signal processing circuit 211 generates the future movement distance of moving part 4 based on the position data acquired by encoder 32 and the future operation command in the operation command plan. Specifically, for example, signal processing circuit 211 generates the future movement distance of moving part 4 based on the second position of moving part 4 based on the position data acquired by encoder 32 and the future operation command. For example, the second position is the position of moving part 4 at the current point in time based on the position data acquired by encoder 32. Thus, signal processing circuit 211 acquires the position of moving part 4 at the current point in time based on the position data of motor 31. In this case, signal processing circuit 211 acquires position data of motor 31 via motor control device 22. Note that the configuration is not limited to the configuration in which signal processing circuit 211 generates the future movement distance, and signal processing circuit 221 may generate the future movement distance. Iii a case where the position of motor 31 and the position of moving part 4 are different from each other, signal processing circuit 211 or signal processing circuit 221 adds difference a (depicted in FIG. 3) between the position of motor 31 and the position of moving part 4 to the acquired position data to obtain the position of moving part 4 at the current point in time. Signal processing circuit 211 is, for example, a computer, and in this case, the above processing can be processed by a program in the computer.

As illustrated in FIG. 2, signal processing circuit 221 includes position control part 221a, position deviation calculation part 221b, and position deviation determination part 221c. Signal processing circuit 221 can be, for example, a computer. In this case, position control part 221a, position deviation calculation part 221b, and position deviation determination part 221c can be implemented by processing by a program in a computer.

Hereinafter, processing in signal processing circuit 221 will be described in detail. Position control part 221a acquires the operation command generated by controller 21. Position control part 221a acquires the operation command and the position data acquired by encoder 32. The drive signal for driving drive device 3 is generated based on the operation command and the position data, and is supplied to drive device 3.

Figure 4:
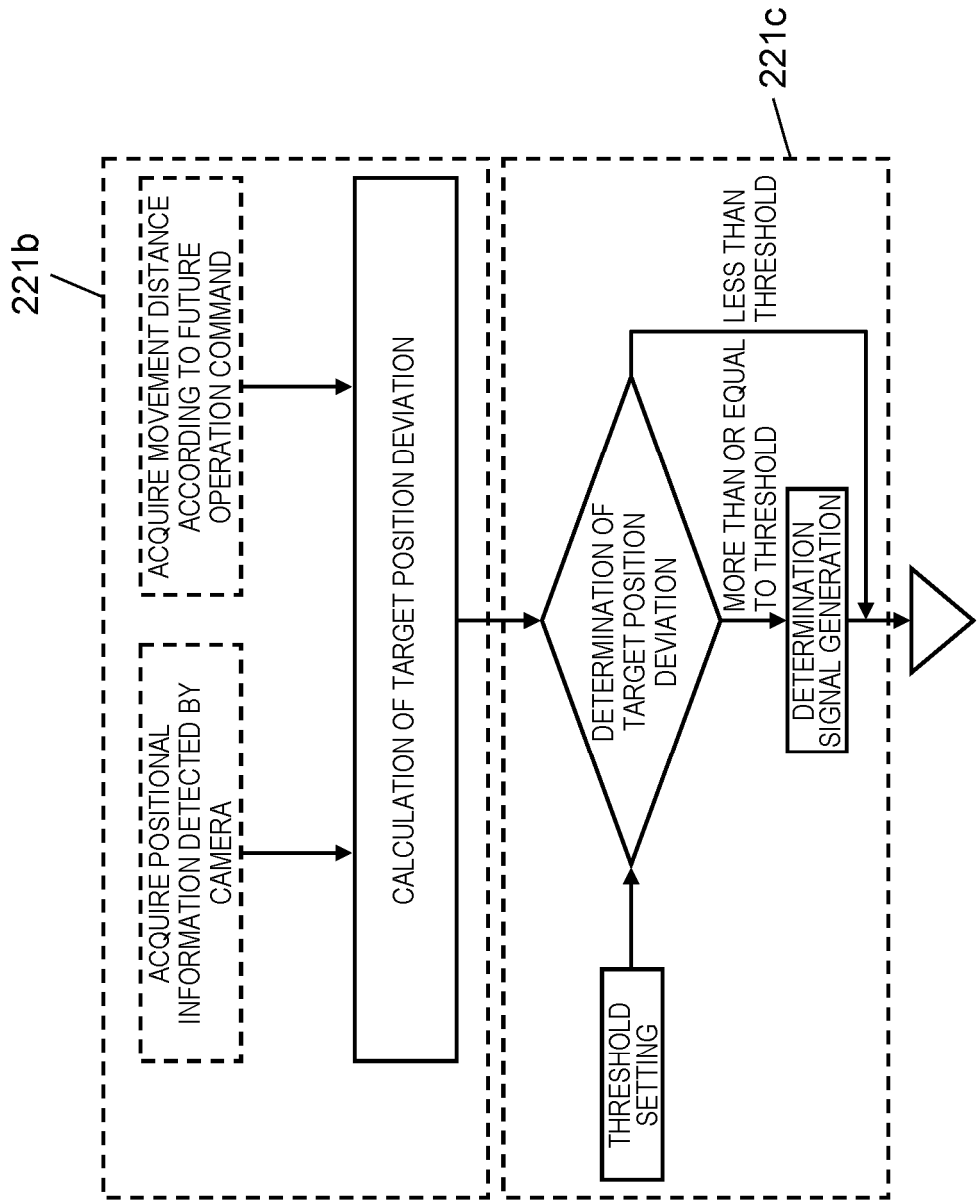
FIG. 4 is a flowchart of the processing in the signal processing circuit.

FIG. 4 is a flowchart illustrating processing in signal processing circuit 221. Signal processing circuit 221 acquires the positional information of moving part 4 from position detection device 23. Further, position deviation calculation part 221b acquires the future movement distance generated by signal processing circuit 211 or signal processing circuit 221.

After these pieces of data are acquired, position deviation calculation part 221b calculates a difference between the positional information of moving part 4 detected by position detection device 23 and the future movement distance, and generates the deviation amount. Subsequently, position deviation determination part 221c outputs a notification signal (determination signal) in a case where the deviation amount is more than or equal to a predetermined threshold or exceeds the threshold.

The threshold is stored in advance in input device memory 222m. Thus, the threshold is also set in position deviation calculation 221a. Motor control device 22 includes input device 222, and the operator stores a predetermined threshold from input device 222 in a memory of signal processing circuit 221. Note that the threshold is set at least before the deviation amount is calculated.

The threshold is set by the subject from the outside, but is not limited to this configuration, and may be set by signal processing circuit 221. When position deviation calculation part 221b calculates a current deviation amount, the current deviation amount is compared with a deviation amount in the past stored in the memory. In a case where the current deviation amount is larger than the deviation amount stored in the memory, the current deviation amount is stored in the memory as a maximum value of the deviation amount up to the present. As a result, the maximum value of the deviation amount from the past to the present is stored in the memory. Position deviation determination part 221c sets, as the threshold, the deviation amount stored in the memory. Note that the threshold is not limited to the maximum value of the deviation amount, and may be set to a value exceeding the maximum value. For example, position deviation determination part 221c may set, as the threshold, a value Obtained by multiplying the maximum value of the deviation amount by a specified value (actual value exceeding 1). With the above configuration, an operation time for determining the threshold can be shortened.

Alternatively, position deviation calculation part 221b stores the deviation amount in the memory whenever the deviation amount is calculated. As a result, the deviation amount from the past to the present is stored in the memory as history data. That is, signal processing circuit 221 stores history data including the deviation amount at a current point in time and the deviation amount in the past. Position deviation determination part 221c sets, as the threshold, a maximum value of a change in the deviation amount during a, predetermined time in the history data. Note that position deviation determination part 221c may set, as the threshold, a value exceeding the maximum value of the change in the deviation amount. For example, position deviation determination part 221c may set, as the threshold, a value obtained by multiplying the maximum value of the change in the deviation amount by a specified value (actual value of 1 or more).

At this time, when a maximum value of the change in the deviation in the past is stored in the memory and the change in the deviation amount from the past to the present time within the predetermined time is larger than the maximum value of the deviation amount in the past stored in the memory, a value of the change in the deviation amount at a current point in time is written to the memory.

In addition, signal processing circuit 221 may set the threshold to be more than or equal to a maximum deviation amount in the history data, or may set the threshold to be a value obtained by multiplying the maximum deviation amount by a predetermined multiple.

Figure 5:
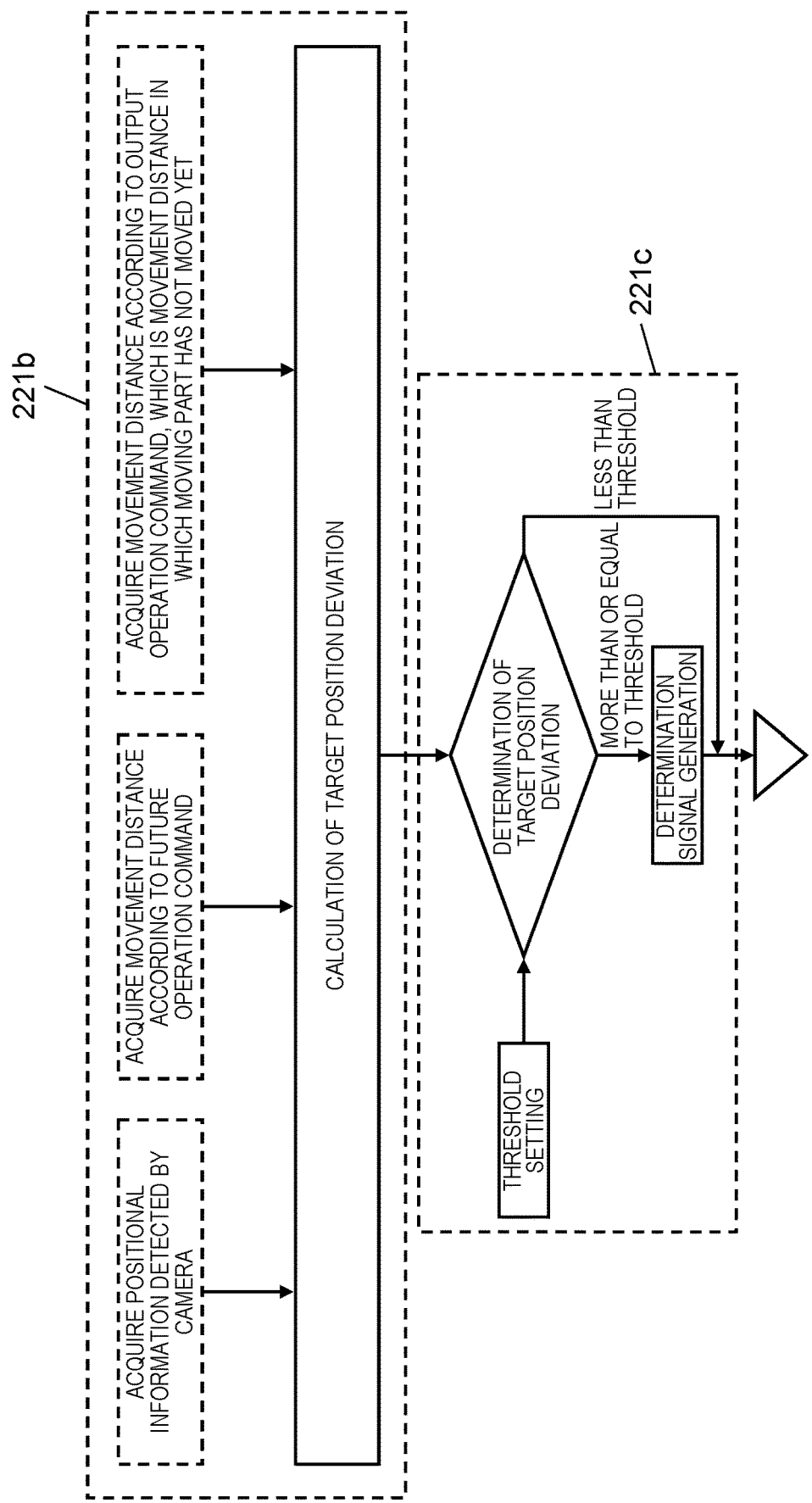
FIG. 5 is a flowchart of another processing in the signal processing circuit.

FIG. 5 is a flowchart illustrating another processing in signal processing circuit 221. Signal processing circuit 221 generates the deviation amount based on a difference between the distance from the first position to the target position and a sum of the future movement distance and a movement distance of moving part 4 based on the operation command output from controller 21, which is a movement distance in which moving part 4 does not move yet.

The first position is the position of moving part 4 detected by position detection device 23. The target position is a target position for moving moving part 4. For example, the distance from the first position to the target position is a distance from the position of moving part 4 at the current point in time detected by position detection device 23 to the target position.

In addition, the future movement distance is a movement distance of moving part 4 based on a future operation command output from controller 21 in the operation command plan. That is, for example, the future movement distance is a movement distance of moving part 4 based on an operation command output from controller 21 after a current point in time in the operation command plan.

In addition, for example, the movement distance of moving part 4 based on the operation command output from controller 21, which is the movement distance in which moving part 4 does not move yet, is a movement distance in which moving part 4 does not move yet among the movement distances based on the operation command already output from controller 21 at the current point in time in the operation command plan.

That is, for example, the sum of the future movement distance and the movement distance of moving part 4 based on the operation command output from controller 21, which is the movement distance in which moving part 4 does not move yet, is a sum of the following movement distances. That is, the movement distance is a sum of the movement distance of moving part 4 based on the operation command not yet output from controller 21 at a current point in time in the operation command plan and the movement distance in which moving part 4 does not move yet in the movement distance of moving part 4 based on the operation command already output from controller 21 at the current point in time in the operation command plan.

As illustrated in FIG. 5, position deviation calculation part 221b acquires positional information detected by the camera (position detection device 23), and calculates the distance from the first position to the target position. In addition, position deviation calculation part 221b acquires the movement distance according to the future operation command. In addition, position deviation calculation part 221b acquires the movement distance according to the operation command already output from controller 21, which is the movement distance in which moving part 4 does not move yet.

Position deviation calculation part 221b generates the deviation amount between the predicted arrival position of moving part 4 and the target position based on the difference between the distance from the first position to the target position and the sum of the future movement distance and the movement distance of moving part 4 based on the operation command output from controller 21, which is the movement distance in which moving part 4 does not move yet.

Position deviation determination part 221c determines the target position deviation and the like similarly to the case of FIG. 4 described above.

As described above, the deviation amount can be calculated more accurately by calculating the deviation amount by using the movement distance of moving part 4 based on the operation command output from controller 21, which is the movement distance in which moving part 4 does not move yet.

Figure 7:
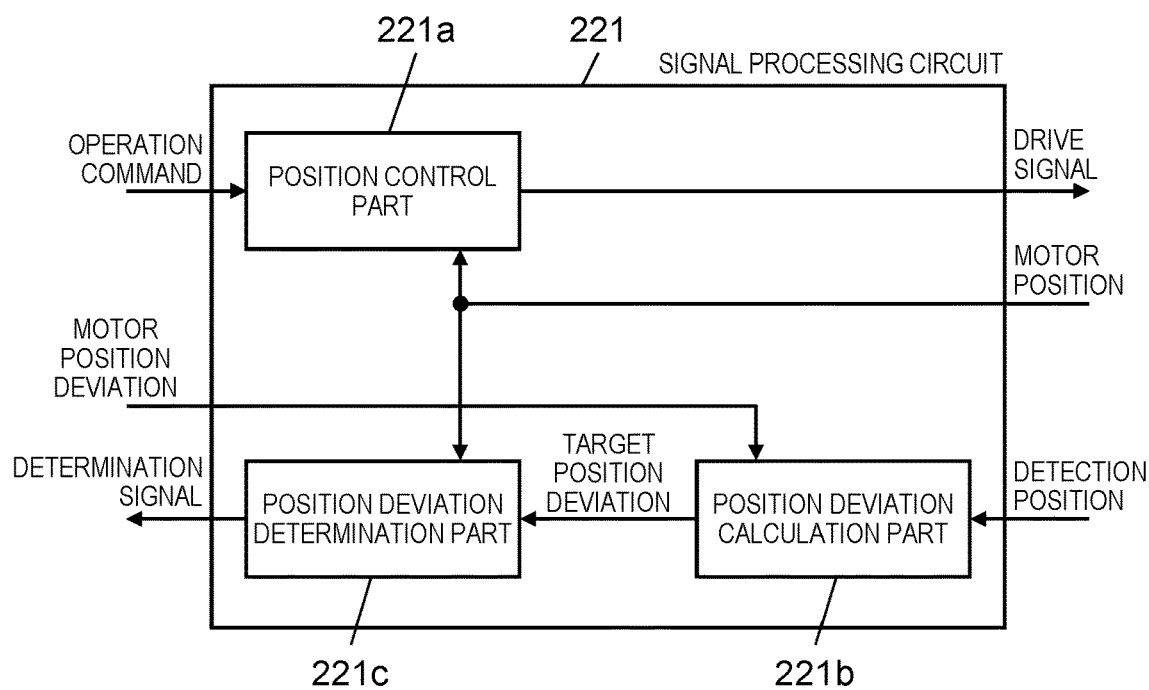
FIG. 7 is an explanatory diagram illustrating processing in a variation of the signal processing circuit in the motor control device.
Figure 8:
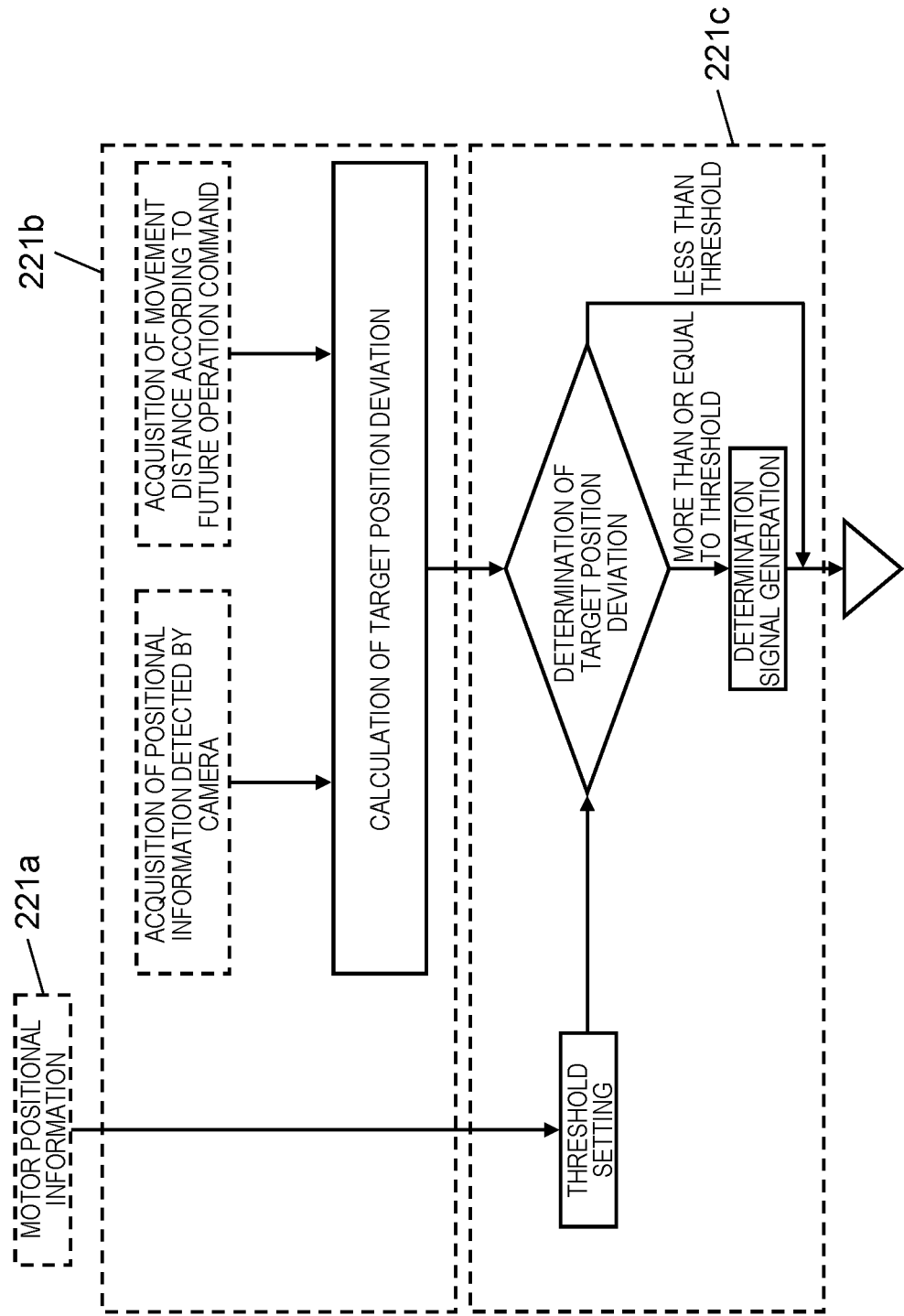
FIG. 8 is a flowchart of the processing in the variation of the signal processing circuit.

FIG. 7 is an explanatory diagram for describing another processing method of setting the threshold in the signal processing circuit. FIG. 8 is a flowchart of the other processing method. Position deviation determination part 221*c* sets the threshold based on the position data by encoder 32 acquired by position control part 221*a*. Specifically, for example, signal processing circuit 221 sets the threshold based on the second position. For example, position deviation determination part 221*c* acquires motor positional information indicating the second position from position control part 221*a* or the like, and sets the threshold based on the second position.

(Variation)

Figure 6:
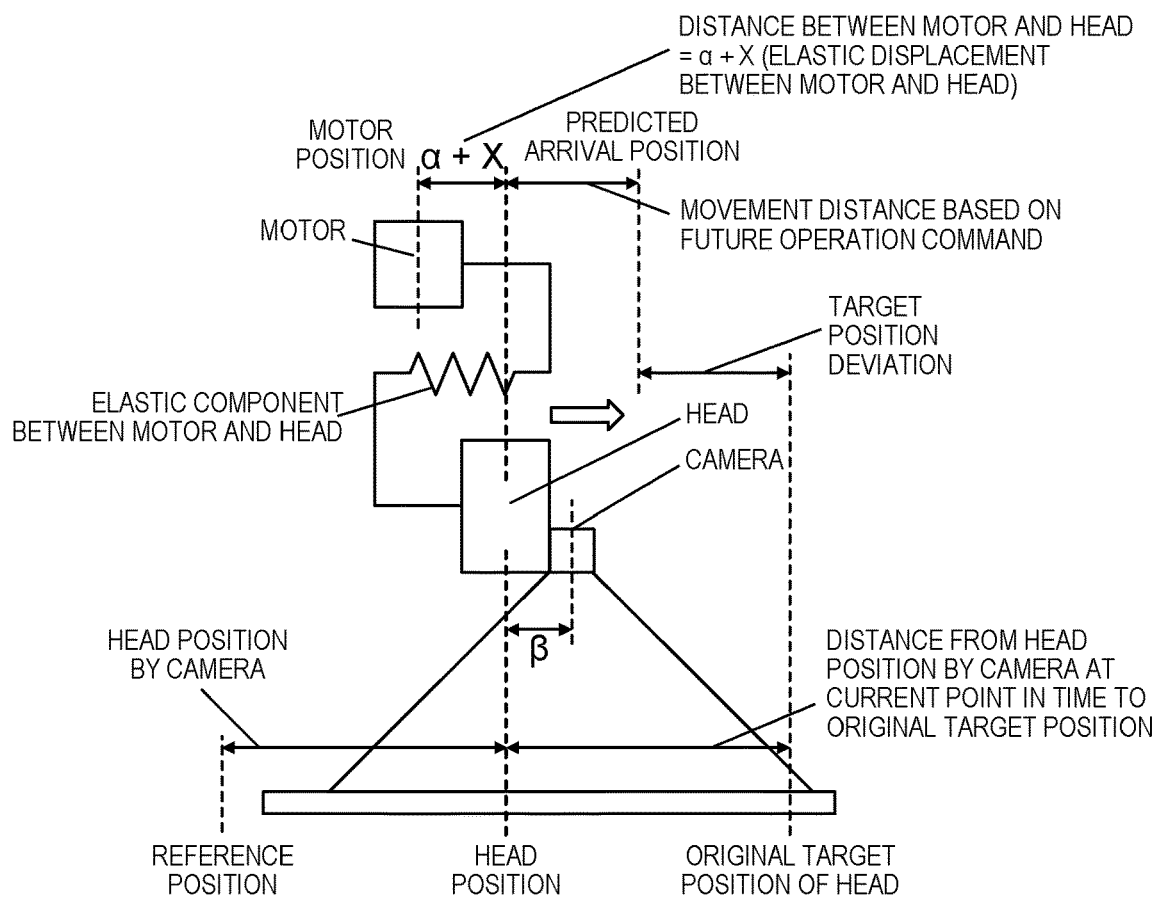
FIG. 6 is an explanatory diagram for describing another processing method when a threshold is set in the signal processing circuit.

Hereinafter, a variation of motor control device 22 will be described. FIG. 6 is an explanatory diagram illustrating processing in a variation of the signal processing circuit. A member connecting motor 31 and moving part 4 generally elastically deforms when moving part 4 moves. That is, a distance between a motor position and a head position varies with the movement of moving part 4. Therefore, in position deviation calculation part 221*b*, the position of moving part 4 based on the position data is corrected based on the operation command. Specifically, for example, signal processing circuit 221 corrects the second position based on the operation command at the current point in time. With this configuration, the deviation amount between moving part 4 and the target position can be determined more accurately.

Figure 9:
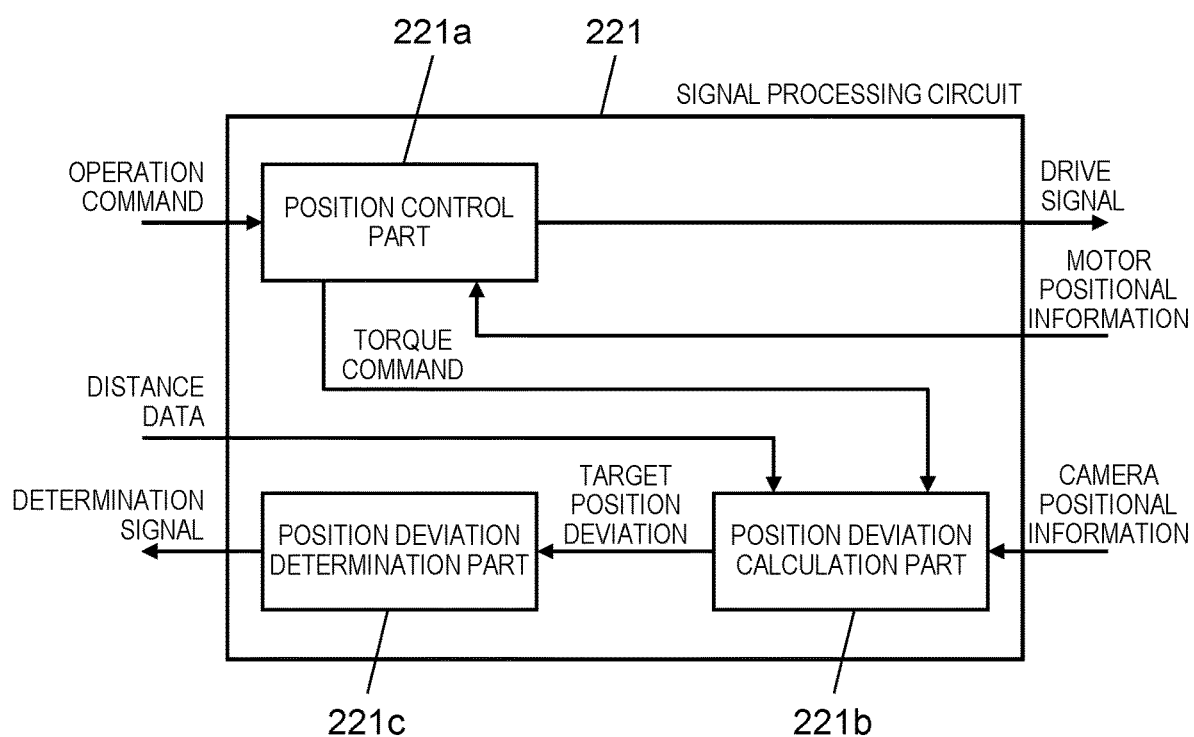
FIG. 9 is a conceptual diagram of processing blocks of the variation of the signal processing circuit.
Figure 10:
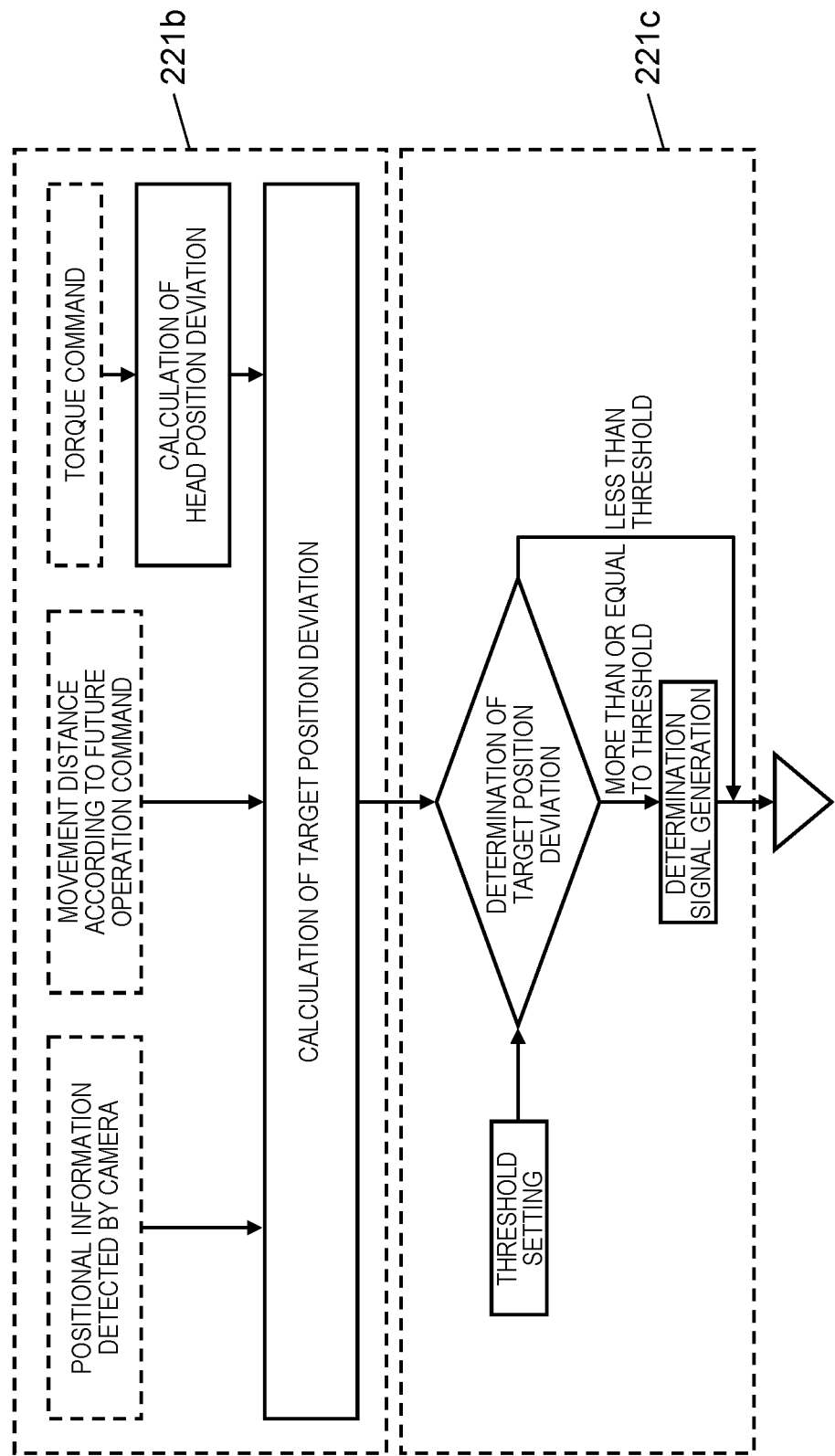
FIG. 10 is a flowchart of the processing in the variation of the signal processing circuit.

FIG. 9 is a conceptual diagram of a processing block of the variation of the signal processing circuit. FIG. 10 is a flowchart of processing in the variation of the signal processing circuit. Displacement of the distance between the motor position and the head position is determined in accordance with an inertia value (inertial force) of motor 31 or moving part 4. The inertia value of motor 31 or moving part 4 is proportional to a torque value of motor 31. Note that position control part 221*a* generates a torque command based on the operation command. Therefore, position deviation calculation part 221*b* acquires the torque command generated by position control part 221*a*, and corrects the position of moving part 4 based on the position data by the value of the torque command.

Note that the configuration is not limited to the configuration in which signal processing circuit 221 corrects the position of moving part 4 based on the position data by the value of the torque command. For example, signal processing circuit 211 may be configured to correct the position of moving part 4 based on the position data. In this case, signal processing circuit 221 outputs the torque command to signal processing circuit 211. Signal processing circuit 221 corrects the position of moving part 4 based on the position data by the torque command.

The above exemplary embodiment has been described above as being illustrative of the technique of the present disclosure. However, the technique of the present disclosure is not limited to the above exemplary embodiment and is also applicable to exemplary embodiments including appropriate changes, replacements, additions, and omissions. In addition, the components described in the exemplary embodiment can be combined in a new exemplary embodiment.

In addition, general or specific aspects of the present disclosure may be implemented by a system, an apparatus, a method, an integrated circuit, a computer program, or a computer-readable recording medium such as a CD-ROM. In addition, the aspects may be implemented with any combination of the system, the device, the method, the integrated circuit, the computer program, and the recording medium.

For example, the present disclosure may be implemented as the motor control system of the above-described exemplary embodiment. In addition, the present disclosure may be implemented as the motor control device. In addition, the present disclosure may be implemented as the motor control method. In addition, the present disclosure may be implemented as a program causing a computer to execute the motor control method, or may be implemented as a computer-readable non-transitory recording medium in which such a program is recorded.

INDUSTRIAL APPLICABILITY

The motor control system according to the present disclosure has an effect, that the operator who uses the motor control system or the administrator and the maintenance person of the system can easily grasp that the moving part, is deviated from the target position, and is useful for use in, for example, an electronic component mounting machine that mounts electronic components.

REFERENCE MARKS IN THE DRAWINGS

1 production apparatus
2 motor control system
3 drive device
4 moving part
5 printed board
21 controller
22 motor control device
23 position detection device
23*a* imaging device
24 notification device
31 motor
32 encoder
211 signal processing circuit
212 input device
213 memory
221 signal processing circuit
222 input device
222*m* input device memory
231 camera
232 image processing device

The invention claimed is:

1. A motor control system that controls an apparatus, the apparatus including a moving part, a drive device, and a motor, the system comprising:
a controller;
a motor control device; and
a position detection device, wherein
the controller includes a first signal processing circuit,
the motor control device includes a second signal processing circuit,
the controller receives, as an input, a movement plan during a period until the moving part reaches a target position from an initial position, sets an operation command plan based on the movement plan, inputs the operation command plan to the first signal processing circuit, and outputs, as an operation command, a movement amount of the moving part at a current point in time to the first signal processing circuit based on the operation command plan, the motor control device inputs the operation command to the second signal processing circuit, and causes the second signal processing circuit to generate a drive signal of the drive device that moves the moving part based on the operation command, the position detection device detects a position of the moving part, and outputs, as a first position, the detected position of the moving part, and the second signal processing circuit generates a deviation amount of the moving part between the first position and the target position based on a future movement distance of the moving part based on a future operation command in the operation command plan, the first position, and the target position, and outputs a notification signal in a case where the deviation amount is more than or equal to a predetermined threshold.

2. The motor control system according to claim 1, wherein the second signal processing circuit generates the deviation amount based on a difference between a distance from the first position to the target position and the future movement distance.

3. The motor control system according to claim 1, wherein the second signal processing circuit generates the deviation amount based on a difference between a distance from the first position to the target position and a sum of the future movement distance and a movement distance of the moving part based on the operation command output from the controller, the movement distance being a movement distance in which the moving part does not move yet.

4. The motor control system according to claim 1, wherein the drive device includes
a motor that moves the moving part based on the operation command, and
an encoder that detects a position of the motor at the current point in time and outputs position data, and
the first signal processing circuit or the second signal processing circuit generates the movement distance based on a second position of the moving part based on the position data and the future operation command.

5. The motor control system according to claim 4, wherein the first signal processing circuit or the second signal processing circuit corrects the second position based on the operation command at the current point in time.

6. The motor control system according to claim 1, wherein the second signal processing circuit stores history data including the deviation amount and a past deviation amount, and
the predetermined threshold is more than or equal to a maximum deviation amount in the history data.

7. The motor control system according to claim 6, wherein the predetermined threshold is a value obtained by multiplying the maximum deviation amount by a predetermined multiple.

8. The motor control system according to claim 1, wherein the second signal processing circuit stores history data including the deviation amount and a past deviation amount, and
sets, as the predetermined threshold, a value more than or equal to a maximum value of a change in a deviation amount for a predetermined time among the history data.

9. The motor control system according to claim 4, wherein the second signal processing circuit sets the predetermined threshold based on the second position.

10. The motor control system according to claim 1, wherein the position detection device is an imaging device.

11. The motor control system according to claim 1, wherein the position detection device moves together with the moving part.

12. A motor control device that receives a command from a controller to control an apparatus including a moving part, a drive device, and a motor, the controller outputting, as an operation command, a movement amount of the moving part at a current point in time based on an operation command plan set for a movement plan during a period until the moving part reaches a target position from an initial position, the motor control device comprising a signal processing circuit that generates a drive signal of the drive device that moves the moving part based on the operation command output from the controller, wherein the signal processing circuit generates a deviation amount of the moving part from the target position based on a future movement distance of the moving part based on a future operation command in the operation command plan, a first position output from a position detection device that detects a position of the moving part and outputs, as the first position, the detected position of the moving part, and the target position, and outputs a notification signal in a case where the deviation amount is more than or equal to a predetermined threshold.

13. A motor control method comprising:
outputting, as an operation command, a movement amount of a moving part at a current point in time based on an operation command plan set for a movement plan during a period until the moving part reaches a target position from an initial position;
generating a drive signal of a drive device that moves the moving part based on the operation command;
detecting a position of the moving part, and outputting, as a first position, the detected position of the moving part;
generating a deviation amount of the moving part from the target position based on a future movement distance of the moving part based on a future operation command in the operation command plan, the first position, and the target position; and
outputting a notification signal in a case where the deviation amount is more than or equal to a predetermined threshold.

* * * * *